United States Patent
Oosterlaken et al.

(10) Patent No.: US 6,316,371 B1
(45) Date of Patent: Nov. 13, 2001

(54) METHOD FOR THE CHEMICAL TREATMENT OF A SEMICONDUCTOR SUBSTRATE

(75) Inventors: Theodorus Gerardus Maria Oosterlaken, Oudewater; Frank Huussen, Bilthoven; Remco Van Der Berg, Lelystad, all of (NL)

(73) Assignee: ASM International N.V., Bilthoven (NL)

( * ) Notice: Subject to any disclaimer, the term of this patent is extended or adjusted under 35 U.S.C. 154(b) by 0 days.

(21) Appl. No.: 09/281,560

(22) Filed: Mar. 30, 1999

(30) Foreign Application Priority Data

Mar. 30, 1998 (NL) .................................................. 1008749

(51) Int. Cl.$^7$ .......................... H01L 21/31; H01L 21/469
(52) U.S. Cl. .......................... 438/770; 438/773; 438/774; 438/775; 438/778; 438/782; 438/787
(58) Field of Search ................................. 438/705, 715, 438/765, 769, 770, 773, 774, 775, 778, 782, 787, 974; 118/724

(56) References Cited

U.S. PATENT DOCUMENTS

| | | | |
|---|---|---|---|
| 5,198,392 | * | 3/1993 | Fukuda et al. ........................ 438/769 |
| 5,210,056 | * | 5/1993 | Pong et al. ........................... 438/773 |
| 5,244,843 | | 9/1993 | Chau et al. . |
| 5,294,571 | * | 3/1994 | Fujishiro et al. .................... 438/770 |
| 5,360,769 | * | 11/1994 | Thakur et al. ....................... 438/762 |
| 5,633,212 | | 5/1997 | Yuuki . |
| 5,738,909 | * | 4/1998 | Thakur et al. .................... 427/255.4 |
| 5,849,102 | * | 12/1998 | Okogoni ............................... 134/19 |
| 5,935,650 | * | 8/1999 | Lerch et al. ...................... 427/255.4 |

FOREIGN PATENT DOCUMENTS 62235740   10/1987   (JP) .

OTHER PUBLICATIONS

Copy of International Search Report.

\* cited by examiner

Primary Examiner—Carl Whitehead, Jr.
Assistant Examiner—Toniae M. Thomas
(74) Attorney, Agent, or Firm—Knobbe, Martens, Olson & Bear, LLP.

(57) ABSTRACT

Method for the chemical treatment of a semiconductor substrate at a raised temperature, such as oxidization. To achieve a uniform treatment of comparatively large wafers in the radial direction, as well as to realize a uniform treatment during the simultaneous treatment of a number of semiconductor substrates placed one after each other, it is proposed, starting with an inert atmosphere, to gradually add oxygen and at the end of the treatment to gradually reduce the oxygen portion.

10 Claims, 6 Drawing Sheets

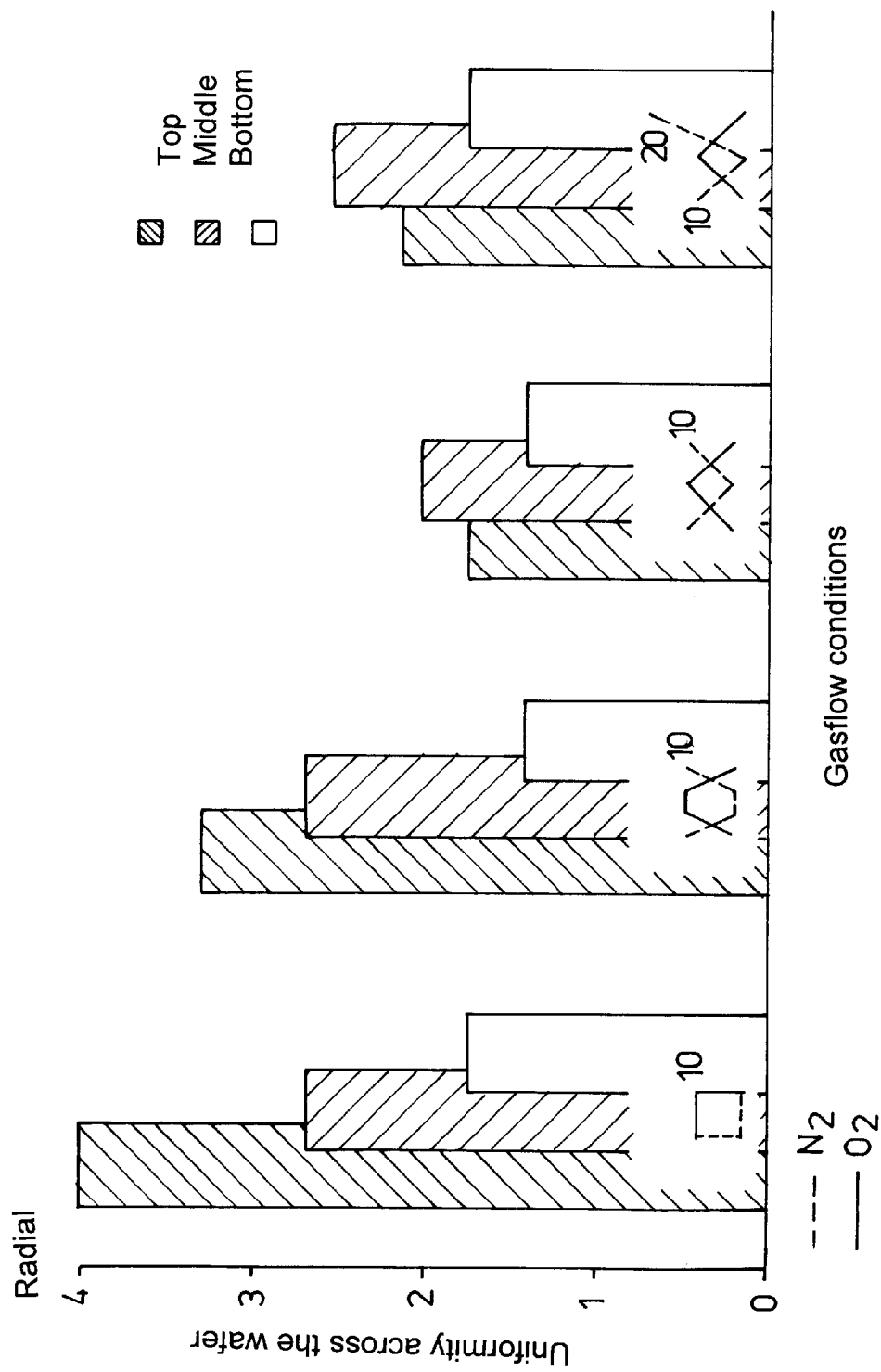

In top of the reactor: wafer nr. 5

Near bottom of reactor: wafer nr. 105

Fig 5

| Process Conditions | O2 (slm) | N2 (slm) | Temp (C) | Time |
|---|---|---|---|---|
| Standby | - | 10.00 | 725 | |
| Boat in | - | 10.00 | 725 | 0:14:00 |
| Stabilise | - | 7.00 | 725 | 0:20:00 |
| Heat up | - | 7.00 | 800 | 0:13:00 |
| Heat up | - | 7.00 | 900 | 0:35:00 |
| Stabilise | - | 7.00 | 900 | 0:30:00 |
| Dry oxidation | 7.00 | - | 900 | 0:05:00 |
| Anneal | - | 10.00 | 900 | 0:05:00 |
| Cool down | - | 10.00 | 725 | 1:05:00 |
| Boat out | - | 10.00 | 725 | 0:14:00 |

METHOD FOR THE CHEMICAL TREATMENT OF A SEMICONDUCTOR SUBSTRATE

FIELD OF INVENTION

The present invention relates to a method for the chemical treatment of a semiconductor substrate.

BACKGROUND OF THE INVENTION

Such a similar method is known from the American patent specification U.S. Pat. No. 5,633,212 and is used to apply oxide layers to semiconductor substrates such as silicon wafers. One or more wafers are placed in a wafer rack and are then transferred to an oven. During the insertion, the atmosphere is inert and will consist mainly of nitrogen.

In this American patent specification U.S. Pat. No. 5,633,212, the so called 'wet oxidation' is described. Water vapor must be made and this is done by fitting a combustion chamber upstream of the reactor. There, oxygen and hydrogen are mixed with each other and combusted at a raised temperature into water vapor.

To control this combustion, the American patent specification in question suggests that after inserting the wafers into the oven, an oxygen atmosphere should first be introduced into the combustion chamber. To that end, the nitrogen supply is completely cut off, from one moment to the next, and the supply of oxygen is gradually started until the intended working maximum is reached. The supply of hydrogen is then gradually started up and, after a certain hydrogen flow is reached, the combustion takes place. During the increase of the oxygen concentration before the introduction of hydrogen, no oxidizing occurs due to the comparatively high concentration of nitrogen in the oven. Only after the abrupt cutting off of the nitrogen supply does the oxidation reaction actually start in the oven. The combustion is then already taking place in the desired manner in the pre-combustion chamber.

In the state of the art there is on the one hand the tendency to decrease the thickness of the oxide layer and on the other hand there is the tendency to increase the dimensions of every wafer. It has been shown that, with these two steps, the application of oil layers becomes critical. By increasing the dimensions of the wafers, increased non-uniform oxidation will occur in the radial direction. In general this is not critical except when a thin layer of oxide has to be applied. In such a case, control of the process and of the oxidized thickness is of great importance. It has also been observed that with a vertical oven where several wafers are inserted that lie vertically behind each other, differences occur in the oxide growth of the uppermost and lowermost wafers. Such differences are also undesirable.

This problem does not only hold for oxidation but for many other processes wherein changes in the process conditions take place, that is, when one process gas is switched over to another process gas.

SUMMARY OF THE INVENTION

The object of the present invention is to improve the treatment of wafers such that oxidation takes place in a more uniform manner. A first proposal to solve this problem is to introduce a vertical temperature profile in a vertical oven into which a number of vertically spaced wafers are introduced. In this way, the reaction speed of the gas can be influenced and a constant reaction in the vertical direction can be realized. It appears, however, that this is not a solution for the phenomena noted above where the thickness of the oxide layer is not constant in the radial direction of the wafer.

It is the object of the present invention to remove this disadvantage and also to provide as treatment conditions as uniform as possible in the radial direction.

This object is realized for a method described above in that second gas for the preparation of the second gaseous atmosphere being introduced into the oven in such a way that with the gradual increase of the flow of that second gas in said oven, the flow of said first gas, that provides that first gaseous atmosphere, decreases supplied to the oven by a substantially equal amount, wherein both the first and second gaseous atmospheres are in that oven for at least 1 minute. In contrast to the American patent specification U.S. Pat. No. 5,633,212, the replacement of the first gaseous atmosphere by the second gaseous atmosphere takes place gradually, so that the supply of the first gas decreases by approximately the same amount as the supply of the second gas increases. In the above-mentioned American patent specification U.S. Pat. No. 5,633,212, the supply of nitrogen is abruptly cut off from one moment to the next without a simultaneous and equally large extra supply of other gasses. According to the invention, in contrast to the prior art, the supply of the first gaseous atmosphere such as nitrogen is not directly switched off by the switching on of the supply of the gas which takes part in the reaction, such as oxygen, but this transition is brought about gradually. Even though the process gas concentration profile as a function of time is still subject to spreading, it appears that if this transition is carried out in this way, the negative effects of the spread on the uniformity of the layer thickness are significantly smaller and the uniformity in layer thickness both in the radial and axial directions are considerably better than when the process gas is switched on according to a step function. It is therefore also possible to grow comparatively thin oxide layers on larger wafers, for example 300 mm wafers.

This also holds for the end of the process. After oxidation, the oxidant present, such as oxygen, is forced out of the tube by switching over to an inert gas, such as nitrogen. The standard method is to switch over in one go, whereas a gradual switching over also results in a considerable improvement in the uniformity of the layer thickness in this case.

In the oxidation reaction described above, the wafers are placed into the oven at approximately 600° C. and, once in the oven, the temperature is raised to between 650 and 1200° C. where the actual oxidation takes place. Then cooling down occurs, possibly preceded by a phase at a raised temperature without the addition of substantial amounts of reactant gas such as oxygen.

The invention can be used both with the direct introduction of the gasses into the oven and with indirect introduction, that is, with further apparatuses being connected in front of the oven, such as a combustion chamber.

According to an advantageous embodiment of the invention, this can be used in particular during oxidation of silicon with oxygen, so-called 'dry' oxidation, wherein the reaction rate is proportional to the oxygen concentration to the power N, where N=0.7. The more that N deviates from 1, the more harmful the effect of spreading on the uniformity. Indeed, when N=1, the effect of the lower concentration by spreading is completely compensated for by the longer exposure time to the reaction gas and there is no harmful effect on the uniformity of the layer thickness. With wet oxidation, N=1 and the application of the present invention does not yield any advantage.

BRIEF DESCRIPTION OF THE DRAWINGS

The invention will be explained further below with reference to the elucidating graphs. These show:

FIG. 3. Equivalent to FIG. 2, showing the thickness uniformity across the wafer for three positions in the boat under different gas flow conditions;

FIG. 5. A time tabel for the introduction of various gasses into an oven.

DETAILED DESCRIPTION OF THE INVENTION

Figure 1:
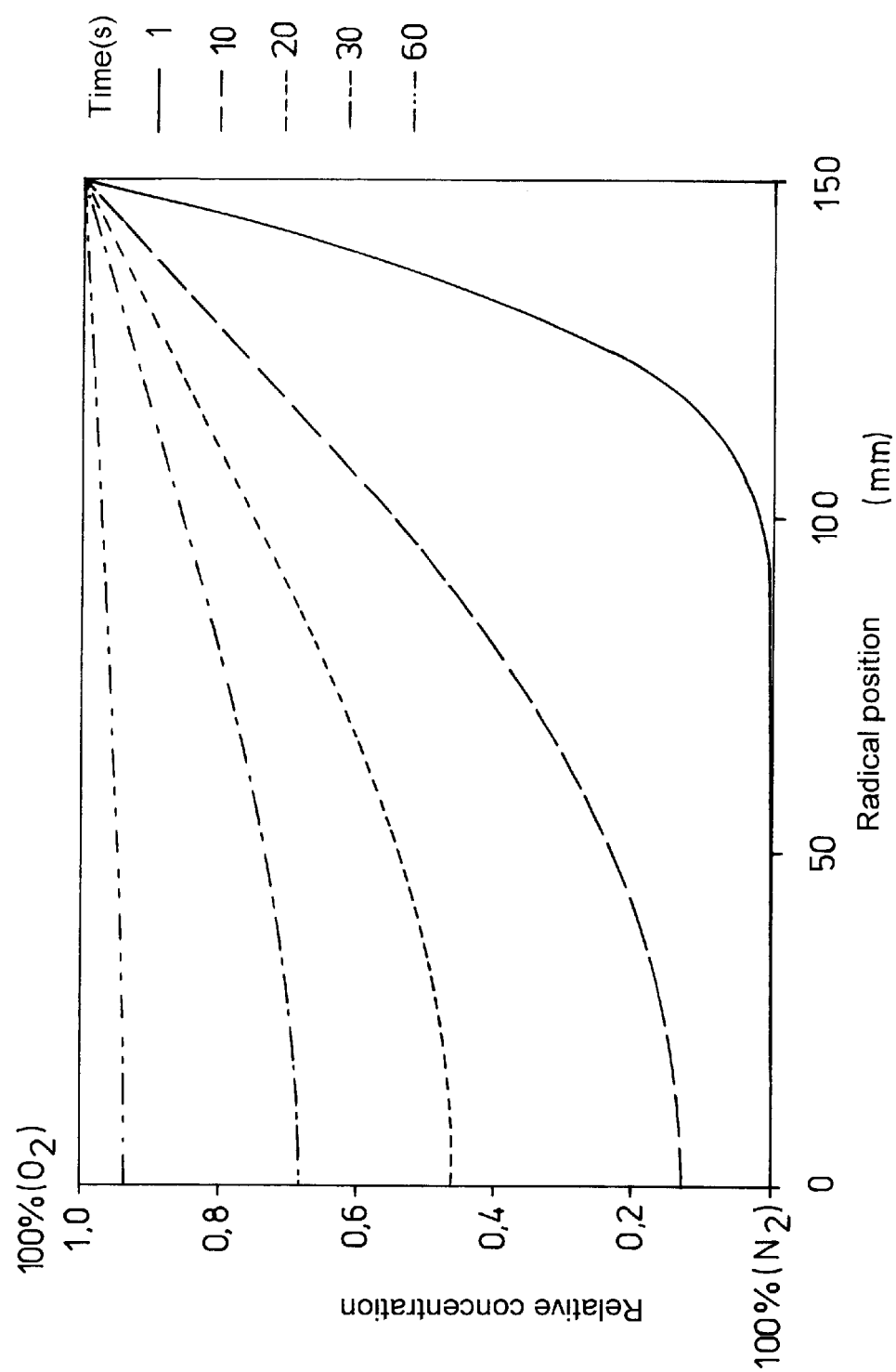
FIG. 1 Concentration profiles as a function of the radial position of a wafer using the method according to the prior art.

FIG. 1 shows a graphical representation of the concentration curve across a wafer with a radius of 150 mm. Various curves are shown at different points in time after the sudden changeover from the supply of nitrogen to the supply of oxygen, according to the prior art. Immediately after the changeover (time =1 sec) a high concentration of oxygen appears to be present near the edge of the wafer and a small concentration in the center. At t=60 sec, a more or less uniform concentration is present. This means that little oxidation has taken place between t=1 s and t=60 s, particularly in the center of the wafer, while considerable oxidation has already taken place at the edge. If the oxidant, such as oxygen, is swapped by an inert gas, such as nitrogen, the opposite occurs. As a result, the differences in layer thickness are largely counteracted, but not entirely, due to spreading of the concentration profile towards the center of the wafer and the fact that the oxidation speed of silicon in oxygen is proportional to the concentration of oxygen to the power 0.7. With comparatively large wafers, this effect is larger and thus is sooner seen as an undesirable effect.

Figure 2:
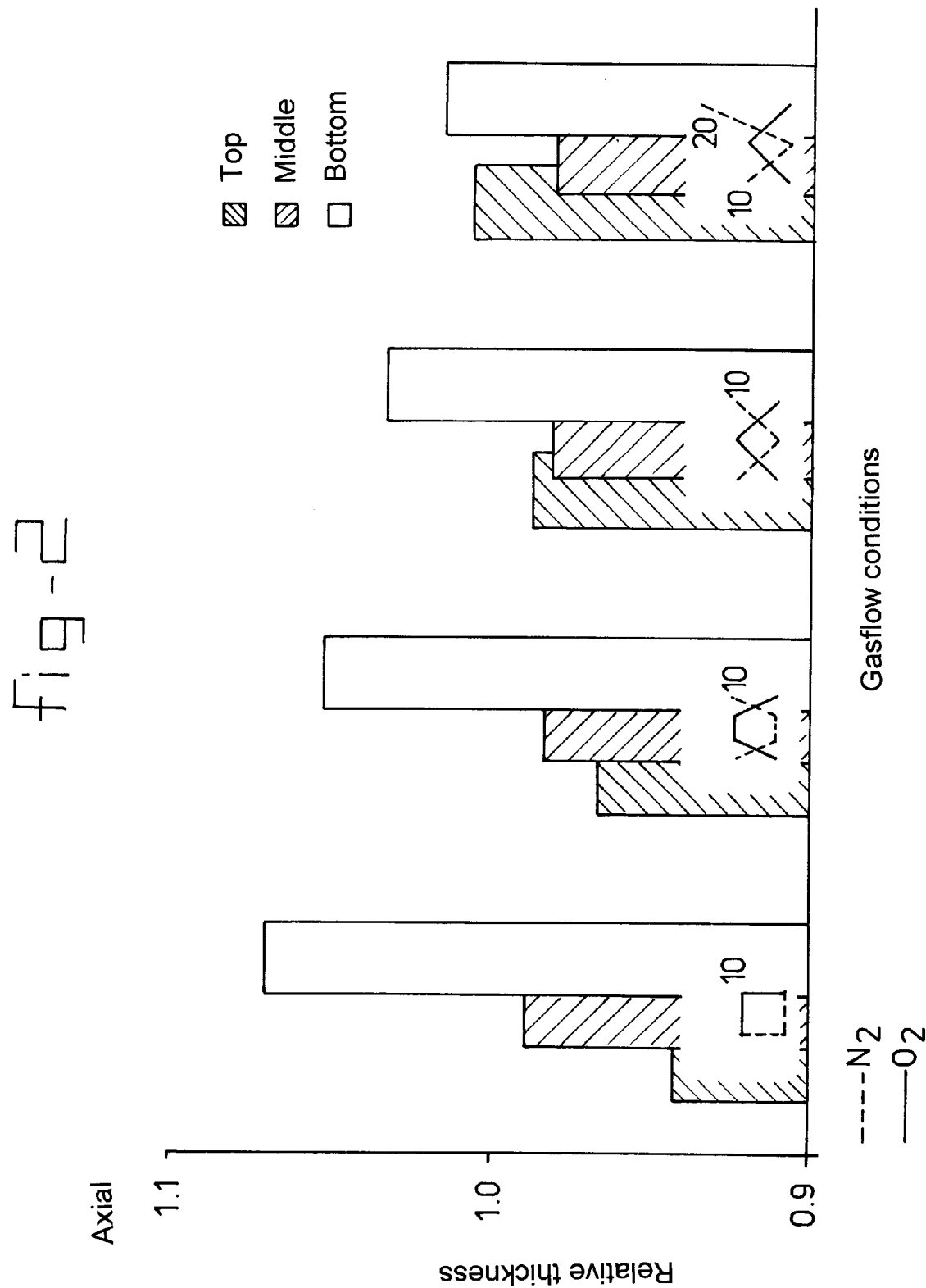
FIG. 2. The optimization achieved with the method according to the first invention wherein the oxidation layer thickness is determined at three different places in the wafer rack, under various gas flow conditions.
Figure 4A:
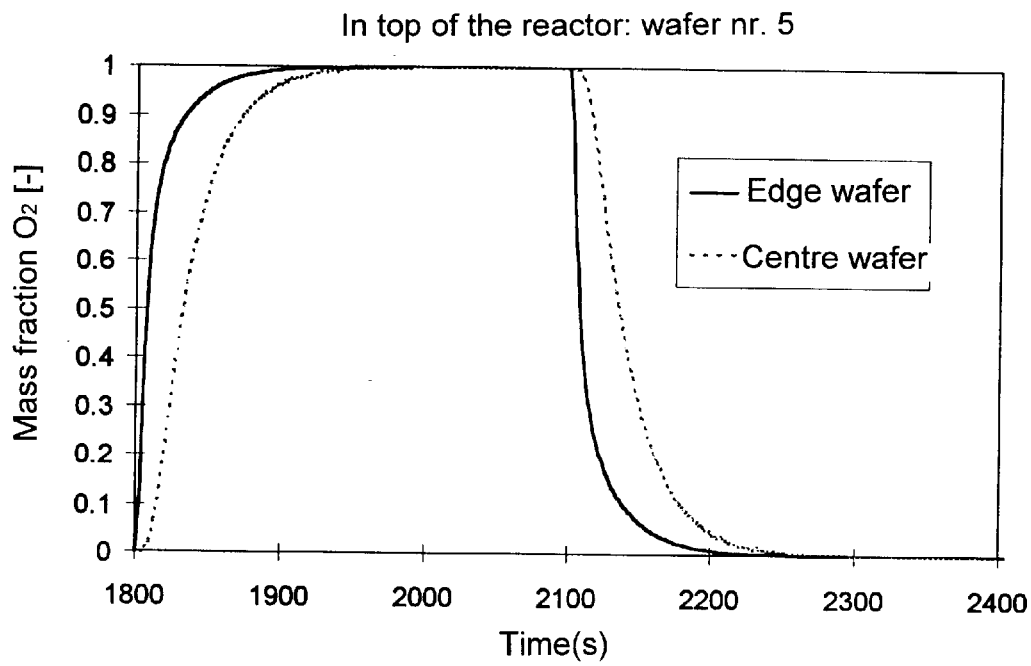
FIGS. 4a–4d an example of the curve of the different gaseous atmospheres as a function of time.
Figure 4B:
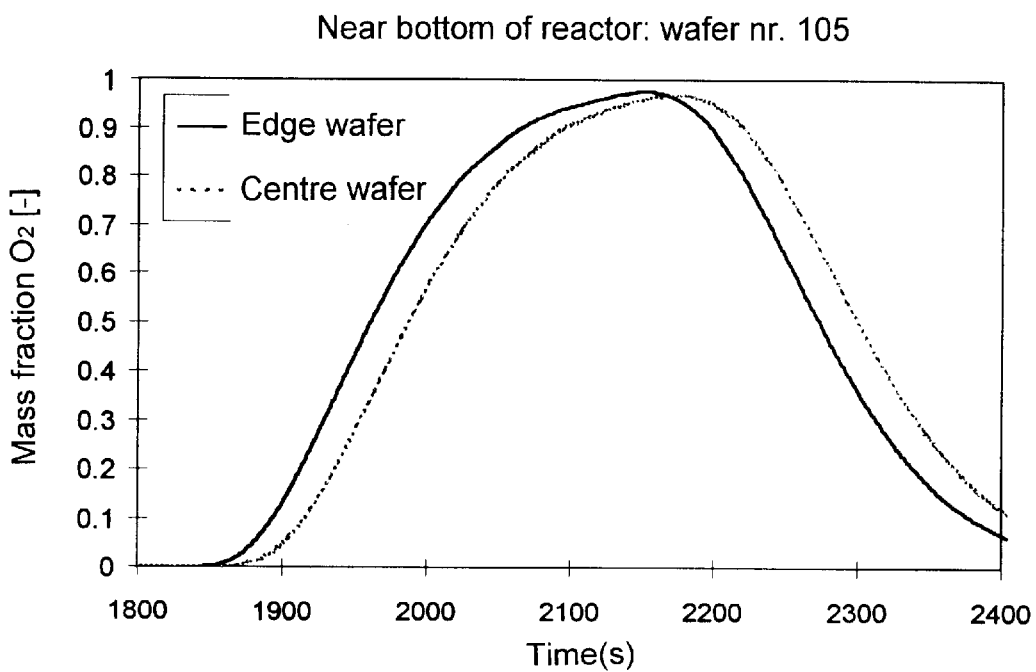
Figure 4C:
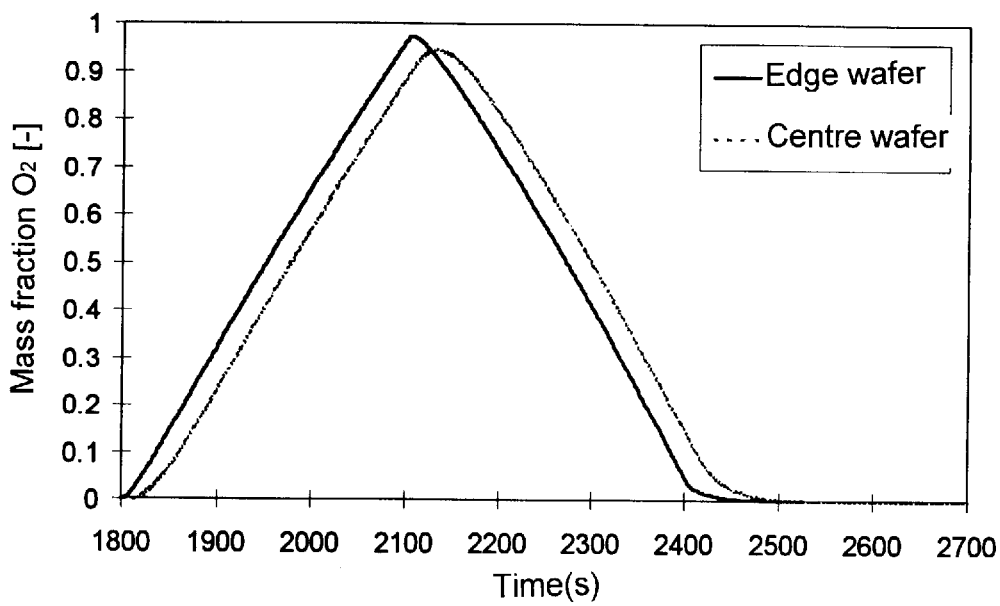
Figure 4D:
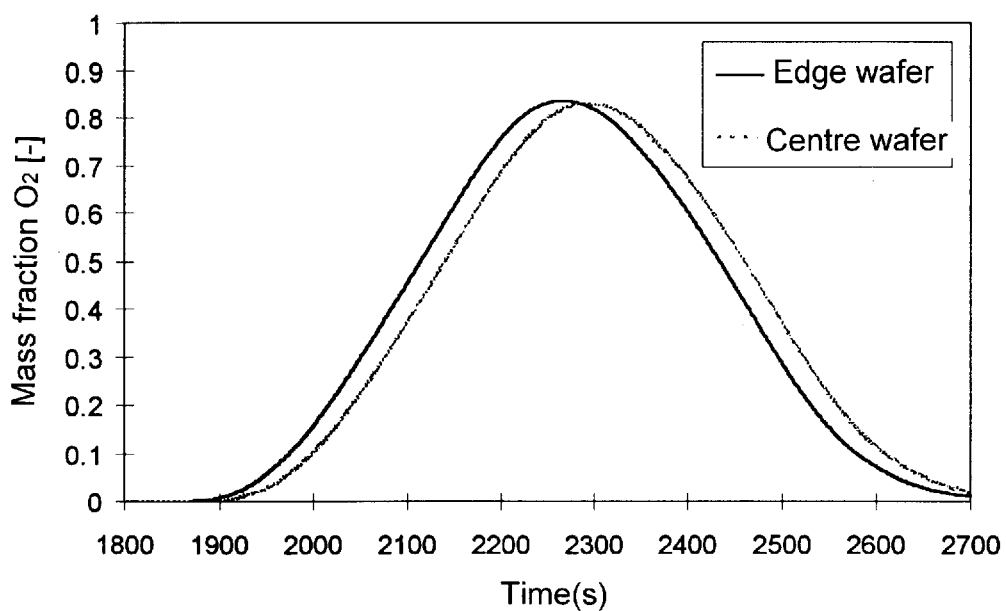

For this reason, it is proposed according to this invention to solve this problem by not actually swapping the inert gas by an oxidant. In FIGS. 2 and 3, different process conditions are represented schematically by the numbers placed next to the process condition. The gas supply is at the top of the reactor and the gas outlet is at the bottom of the reactor.

In the left most bar chart of FIGS. 2 and 3, the condition is assumed where 10 slm nitrogen is switched over in one go to 10 slm oxygen. The oxygen flow is maintained for 5 minutes and is then switched back in one go to nitrogen. In the second bar chart of FIGS. 2 and 3, a gradual switching off from 10 slm nitrogen to 0 slm nitrogen takes place over 3 minutes while the oxygen flow is simultaneously increased from 0 to 10 slm. The oxygen flow is then maintained at 10 slm for 2 minutes and finally, over a period of 3 minutes, the oxygen flow is gradually reduced again from 10 to 0 slm while the nitrogen flow increases accordingly.

In the third bar chart of FIGS. 2 and 3, the oxygen flow is increased over a period of 5 minutes from 0 to 10 slm and immediately afterwards is decreased again from 10 to 0 slm over a period of 5 minutes, while the opposite happens to the nitrogen flow. In the rightmost bar chart, a particular and considerable increase in the nitrogen flow takes place at the end of the treatment (up to 20 slm) which implies a special, thorough flushing.

Different oxide-deposits belong to the different profiles. This is shown vertically in FIGS. 2 and 3. The left-hand column of every bar chart in FIG. 2 shows the relative thickness (compared to the average oxide thickness) of the uppermost wafer of a series of wafers placed in a vertical rack in a vertical oven, the middle column shows the circumstances of the middle wafer in that rack and the right-hand column shows the circumstances of the lowermost wafer. From FIG. 2 it is clear that the profile according to the invention, that is, the rightmost three bar charts, produce a considerable improvement with respect to the leftmost bar chart.

In FIG. 3, the corresponding uniformity of the layer thickness across the wafer is shown under these different gas flow conditions. Uniformity is defined here as the difference between the maximum and minimum oxide layer thickness divided by 2. Under standard conditions (leftmost bar chart) the uniformity is worse at the top of the boat than at the bottom. With profiles according to the invention, shown in the rightmost three bar charts, the uniformity is considerably improved.

In FIG. 4, an example is given of simulation calculations of the curve of the mass fraction of oxygen in nitrogen as a function of time, at several places in the reactor. The gas inlet is situated at the top of the reactor and the gas outlet is at the bottom. FIG. 4 shows the curve of the mass fraction of oxygen in the case that, after 1800 seconds (=30 minutes), nitrogen flushing at 7 slm is abruptly switched over to oxygen at 7 slm. After supplying oxygen for 300 seconds (=5 minutes) it is again abruptly switched over to nitrogen. A considerable spreading of the oxygen profile can be perceived from the edge to the middle of the wafer and, to a greater degree, from the top of the reactor to the bottom. FIG. 4b shows the curve of the oxygen profile for the case that nitrogen is switched over to oxygen according to the present invention: between t=1800 and 2100 s the oxygen flow increases linearly from 0 to 7 slm and the nitrogen flow decreases linearly from 7 to 0 slm. The opposite then takes place between t=2 100 and 2400 s. Spreading also takes place in this case, but the relative change in shape of the oxygen profile is considerably smaller than in FIG. 4a where the gasses are switched over abruptly according to the state of the art. In reality, the switching according to the state of the art will not happen with an ideal 'block profile' but will use a 'soft-start' of the gas flow regulators. This means that in a few seconds, a gas flow is brought up to the working level while, according to the invention, this length of time is measured on a minutes scale. FIG. 5 shows the table with the protocol of an example process for the oxidation with oxygen after nitrogen has been introduced for some while.

While the invention above is described with reference to a preferred embodiment, it will be understood that for other treatments or at other temperatures or other reactor dimensions, the dosage of the gasses is adjusted. Likewise the duration and manner in which the gradual switching over of the gasses occurs can be adjusted and optimized for the circumstances. The sort of gas chosen will also depend on the process. As an example, oxygen is considered as an oxidant for dry oxidation carried out at approximately 900° C. The method according to the invention can be applied for the handling of one or more wafers which can be introduced horizontally or vertically. For persons skilled in the art, such changes will be clear after reading the description above and are within the scope of the attached claims.

What is claimed is:

1. A method for chemical treatment of a semiconductor substrate at a predetermined temperature, comprising:

inserting a semiconductor substrate into an oven while in a first gaseous atmosphere including a first inert gas;

heating the semiconductor substrate;

replacing the first gaseous atmosphere by a second gaseous atmosphere including a second gas that oxidizes the semiconductor substrate, wherein creating the second gaseous atmosphere includes introducing the second gas into the oven at a first flow rate that gradually increases while a second flow rate of the first gas decreases by approximately the same amount as the second gas increases, and wherein the first gas and the second gas are supplied to the oven for at least one minute; and removing the semiconductor substrate from the oven.

2. The method of claim 1, further comprising replacing the second gaseous atmosphere with a third gaseous atmosphere including a third gas after oxidizing the semiconductor substrate with the second gas, wherein said second atmosphere and said third gaseous atmosphere are present in the oven for at least one minute.

3. The method of claim 2, wherein said third gaseous atmosphere comprises an inert gas.

4. The method of claim 1, further comprising chemically treating the semiconductor substrate at a temperature in the oven between 650° C. and 1200° C.

5. The method of claim 1, further comprising simultaneously treating a number of spaced semiconductor substrates.

6. The method of claim 1, wherein during said inserting a semiconductor substrate the first gaseous atmosphere comprises a portion of the second gaseous atmosphere, and wherein during said removing the semiconductor substrate the second gaseous atmosphere comprises a portion of the first gaseous atmosphere.

7. The method of claim 1, wherein the first gaseous atmosphere comprises nitrogen and the second gaseous atmosphere comprises oxygen.

8. The method of claims 7, wherein the second gaseous atmosphere comprises oxygen at a concentration of at least 20% volume.

9. The method of claim 7, further comprising pre-heating the oven to a temperature of at least 600° C., and oxidizing the semiconductor substrate at a temperature in the oven of at least 900° C.

10. The method of claim 1, wherein the first and third gaseous atmospheres comprise nitrogen and the second gaseous atmosphere comprises oxygen.

* * * * *